(12) United States Patent
Mears et al.

(10) Patent No.: US 7,045,377 B2
(45) Date of Patent: May 16, 2006

(54) METHOD FOR MAKING A SEMICONDUCTOR DEVICE INCLUDING A SUPERLATTICE AND ADJACENT SEMICONDUCTOR LAYER WITH DOPED REGIONS DEFINING A SEMICONDUCTOR JUNCTION

(75) Inventors: Robert J. Mears, Wellesley, MA (US); Robert John Stephenson, Newton Upper Falls, MA (US)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 11/096,828

(22) Filed: Apr. 1, 2005

(65) Prior Publication Data

US 2005/0170591 A1    Aug. 4, 2005

Related U.S. Application Data

(63) Continuation-in-part of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003.

(51) Int. Cl.
*H01L 21/00* (2006.01)
(52) U.S. Cl. .................... 438/45; 438/45; 438/47; 438/172; 257/15
(58) Field of Classification Search ............... 438/45, 438/47, 172; 257/14, 15
See application file for complete search history.

(56) References Cited

U.S. PATENT DOCUMENTS

| 4,485,128 A | 11/1984 | Dalal et al. ............... 427/85 |
| 4,594,603 A | 6/1986 | Holonyak, Jr. ............... 357/16 |
| 4,882,609 A | 11/1989 | Schubert et al. ............... 357/22 |
| 4,908,678 A | 3/1990 | Yamazaki ............... 357/4 |
| 4,937,204 A | 6/1990 | Ishibashi et al. ............ 437/110 |
| 4,969,031 A | 11/1990 | Kobayashi et al. ............ 357/63 |
| 5,055,887 A | 10/1991 | Yamazaki ............... 357/4 |

(Continued)

FOREIGN PATENT DOCUMENTS

GB    2347520    9/2000

(Continued)

OTHER PUBLICATIONS

Patent Abstracts of Japan, vol. 012, No. 080 (E-590), Mar. 12, 1988 & JP 62 219665 A (Fujitsu Ltd), Sep. 26, 1987 abstract.

(Continued)

*Primary Examiner*—David Nelms
*Assistant Examiner*—Thinh T Nguyen
(74) *Attorney, Agent, or Firm*—Allen, Dyer, Doppelt, Milbrath & Gilchrist, P.A.

(57) ABSTRACT

A method for making a semiconductor device may include forming a superlattice comprising a plurality of stacked groups of layers. Each group of layers of the superlattice may include a plurality of stacked base silicon monolayers defining a base silicon portion and an energy band-modifying layer thereon. The energy band-modifying layer may include at least one non-semiconductor monolayer constrained within a crystal lattice of adjacent base silicon portions. The method may further include forming a semiconductor layer adjacent the superlattice and comprising at least one first region therein including a first conductivity type dopant. At least one second region may be formed in the superlattice including a second conductivity type dopant to define, with the at least one first region, at least one semiconductor junction.

20 Claims, 7 Drawing Sheets

U.S. PATENT DOCUMENTS

| | | | |
|---|---|---|---|
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A * | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B1 | 10/2002 | Takagi | 257/77 |
| 6,498,359 B1 | 12/2002 | Schmidt et al. | 257/190 |
| 6,501,092 B1 | 12/2002 | Nikonov et al. | 257/29 |
| 6,521,549 B1 | 2/2003 | Kamath et al. | 438/786 |
| 6,566,679 B1 | 5/2003 | Nikonov et al. | 257/29 |
| 6,608,327 B1 | 8/2003 | Davis et al. | 257/76 |
| 6,621,097 B1 | 9/2003 | Nikonov et al. | 257/17 |
| 6,711,191 B1 | 3/2004 | Kozaki et al. | 372/43 |
| 6,748,002 B1 | 6/2004 | Shveykin | 372/45 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Patent Abstracts of Japan, vol. 010, No. 179 (E-414), Jun. 24, 1986 & JP 61 027681 A (Res Dev Corp of Japan), Feb. 7, 1986 abstract.

Luo et al., *Chemical Design of Direct-Gap Light-Emitting Silicon*, published Jul. 25, 2002, The American Physical Society; vol. 89, No. 7.

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature. com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, 2004 Nanosys, Inc.

\* cited by examiner

METHOD FOR MAKING A SEMICONDUCTOR DEVICE INCLUDING A SUPERLATTICE AND ADJACENT SEMICONDUCTOR LAYER WITH DOPED REGIONS DEFINING A SEMICONDUCTOR JUNCTION

CROSS-REFERENCE TO RELATED APPLICATIONS

This application is a continuation-in-part of U.S. patent application Ser. No. 10/647,060 filed Aug. 22, 2003, now U.S. Pat. No. 6,958,486, which is a continuation-in-part of U.S. patent application Ser. No. 10/603,696 now abandoned and Ser. No. 10/603,621 filed on Jun. 26, 2003, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. patent application Ser. No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. patent application Ser. No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391–402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

In view of the foregoing background, it is therefore an object of the present invention to provide a method for making a semiconductor device having relatively high charge carrier mobility, for example.

This and other objects, features, and advantages in accordance with the present invention are provided by a method for making a semiconductor device which may include forming a superlattice comprising a plurality of stacked groups of layers. More particularly, each group of layers of the superlattice may include a plurality of stacked base silicon monolayers defining a base silicon portion and an energy band-modifying layer thereon. The energy band-modifying layer may include at least one non-semiconductor monolayer constrained within a crystal lattice of adjacent base silicon portions. The method may further include forming a semiconductor layer adjacent the superlattice and comprising at least one first region therein including a first conductivity type dopant. At least one second region may be formed in the superlattice including a second conductivity type dopant to define, with the at least one first region, at least one semiconductor junction. Accordingly, the semiconductor device may advantageously be used in a number of applications. By way of example, such applications may include diodes, field-effect or bipolar transistors, optical devices, etc.

The at least one first region and the at least one second region may be in direct contact with one another, or they may be spaced from one another. Moreover, the at least one first region and the at least one second region may be arranged in a vertical direction so that the at least one semiconductor junction extends in a lateral direction. Alternately, the at least one first region and the at least one second region may be arranged in a lateral direction so that the at least one semiconductor junction extends in a vertical direction.

Each energy band-modifying layer may include a non-semiconductor such as oxygen, nitrogen, fluorine, and carbon-oxygen, for example. Moreover, each energy band-modifying layer may be a single monolayer thick, and each base silicon portion may be less than eight monolayers thick. Forming the superlattice may further include forming a base semiconductor cap layer on an uppermost group of layers. Moreover, all of the base silicon portions may be a same number of monolayers thick, or at least some of the base silicon portions may be a different number of monolayers thick.

DETAILED DESCRIPTION OF THE PREFERRED EMBODIMENTS

Figure 1:
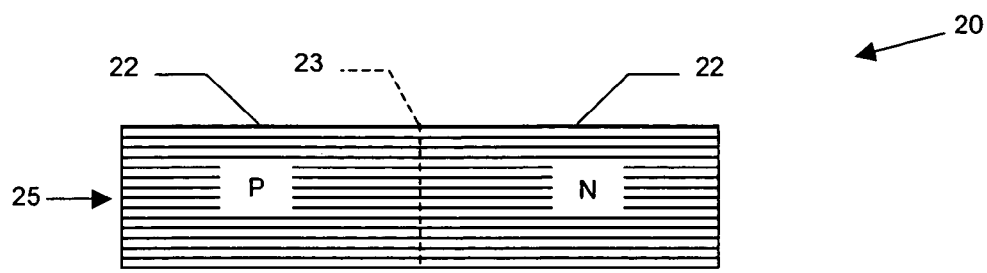
FIGS. 1–4 are schematic cross-sectional views of different embodiments of semiconductor device portions in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} f(E(k,n), E_F, T) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. Referring to FIG. 1, one such example would be a semiconductor device 20 including a superlattice 25 with a pair of oppositely-doped regions 21, 22 therein defining a semiconductor junction 23. In the illustrated example, the first region 21 has a P-type conductivity and the second region 22 has an N-type conductivity to thereby form a P/N junction 23. The P/N junction structure of the semiconductor device 20 allows it to advantageously be used in numerous applications. By way of example, such applications may include diodes, field-effect or bipolar transistors, optical devices, etc., as will be appreciated by those skilled in the art.

Figure 2:
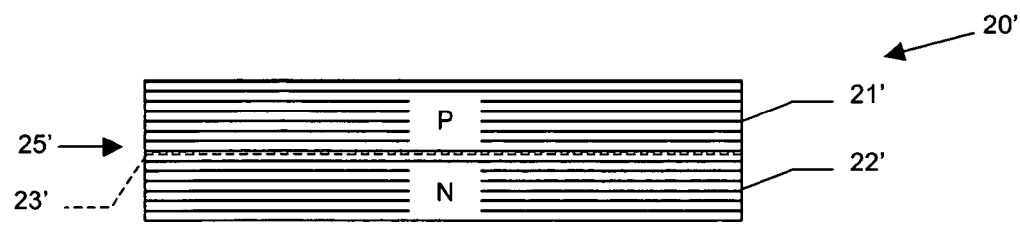

In the illustrated example, the first and second regions 21, 22 are in direct contact with one another. The first and second regions 21, 23 are also arranged in a lateral direction (i.e., side-by-side) so that the semiconductor junction 23 extends in a generally vertical direction. In other configurations, the first and second regions 21, 22 may also be arranged in a vertical direction so that the semiconductor junction 23' extends in a generally lateral direction, as shown in FIG. 2.

Figure 3:
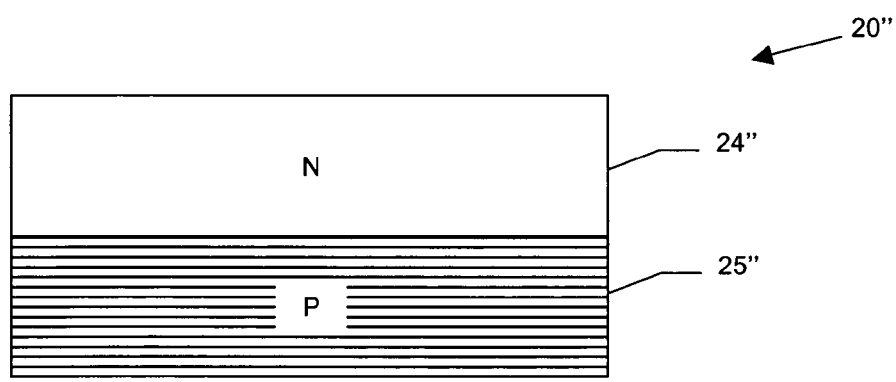

In still another configuration described now with reference to FIG. 3, the semiconductor device 20" may also include a semiconductor layer 24" adjacent the superlattice. In the illustrated example, the semiconductor layer 24" is vertically above the superlattice 25", but in other embodiments it may be below the superlattice or laterally adjacent the superlattice, as will be appreciated by those skilled in the art. Here, the P-type dopant encompasses the entire superlattice 25", and the N-type dopant encompasses the entire semiconductor layer 24", although the dopants may occupy smaller portions in other embodiments.

Figure 4:
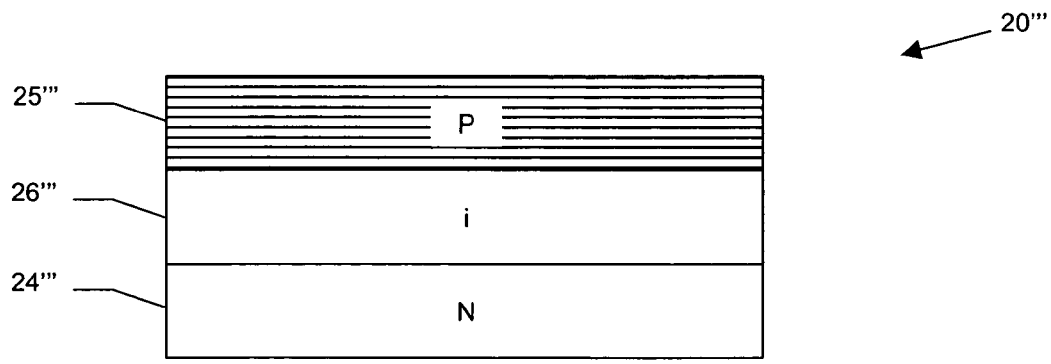

In yet another configuration, the first and second regions 21, 22 may be spaced from one another. Referring more particularly to FIG. 4, the semiconductor device 20''' has a P-i-N structure with an intrinsic semiconductor layer 26''' between the semiconductor layer 24''', which has an N-type dopant, and the superlattice 25''', which has a P-type dopant. Of course, an intrinsic region may also be used where the N and P regions are both in the superlattice 25, such as between the first and second regions 21, 22 and 21', 22' of the devices 20, 20', respectively.

It should be noted that multiple pairs of oppositely-doped regions 21, 22 may be used in some embodiments to provide multiple semiconductor (i.e., PN) junctions. Furthermore, more than one of the first or second regions 21, 22 may be used with the oppositely doped region used to provide PNP or NPN structures, as will be appreciated by those skilled in the art. It will also be appreciated that the first and second regions 21, 22 need not always be arranged in vertical or lateral directions. That is, the regions 21, 22 may be arranged in a first diagonal direction so that the semiconductor junction 23 extends in a second diagonal direction transverse to the first diagonal direction. This may be done, for example, using angled dopant implantations, as will be understood by those of skill in the art.

Figure 5:
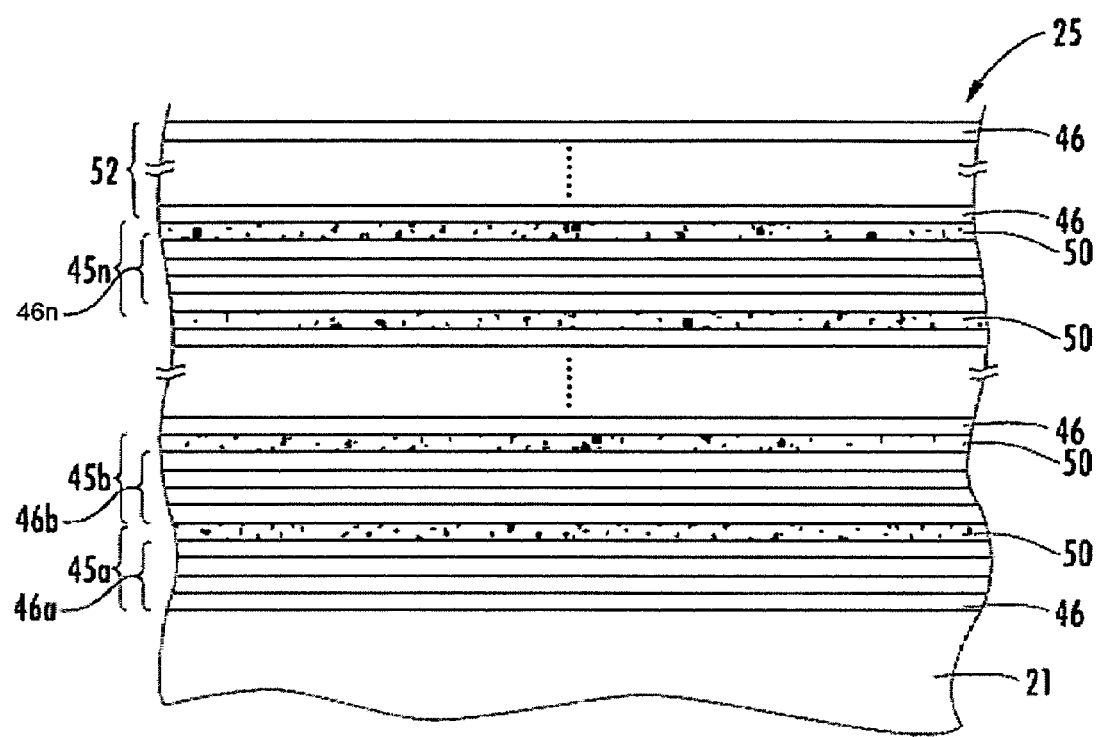
FIG. 5 is a greatly enlarged schematic cross-sectional view of the superlattice as shown in FIG. 1.
Figure 6:
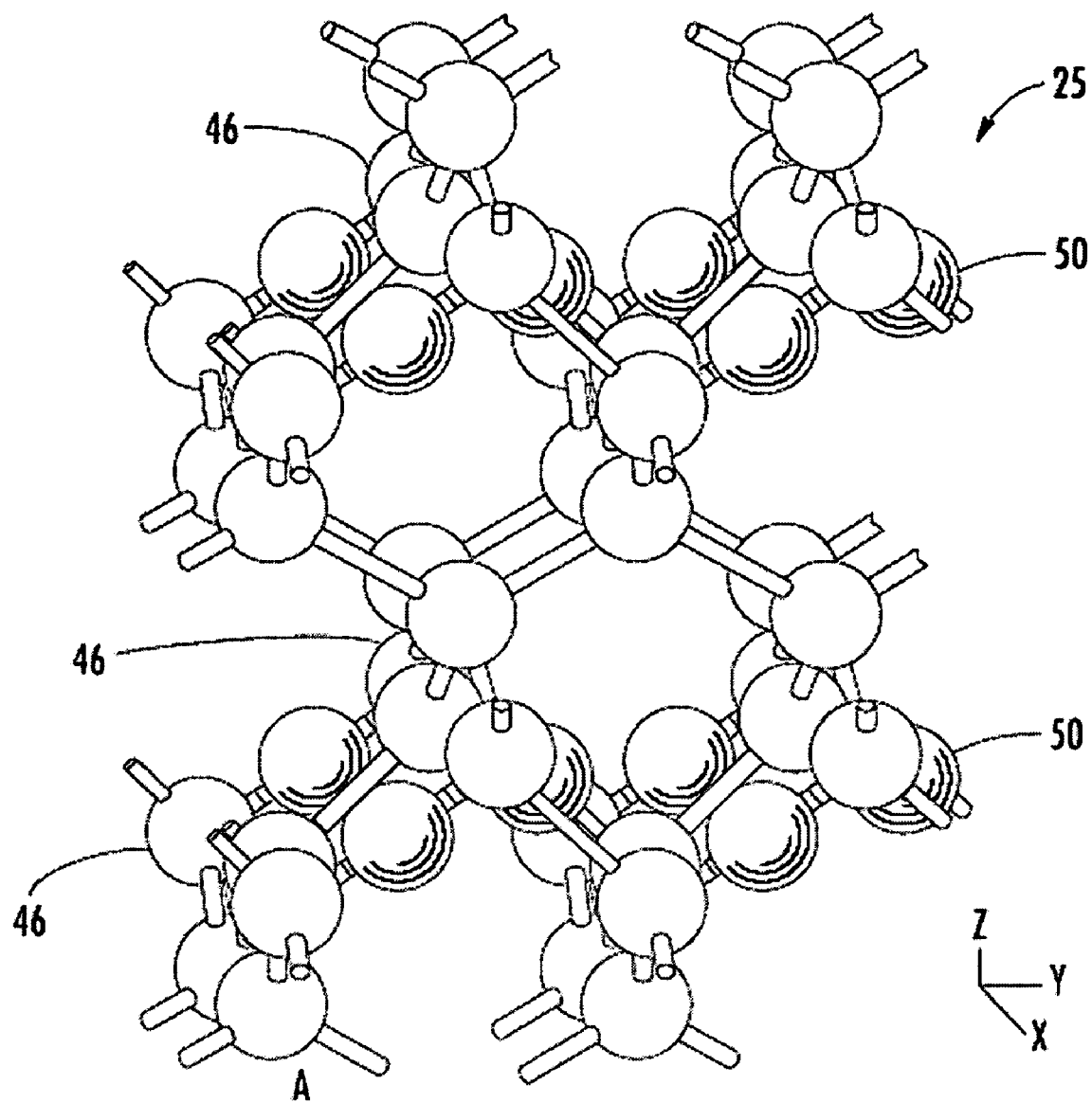
FIG. 6 is a perspective schematic atomic diagram of a portion of the superlattice shown in FIG. 1.

Referring now additionally to FIGS. 5 and 6, the materials or structures are in the form of a superlattice 25 whose structure is controlled at the atomic or molecular level and may be formed using known techniques of atomic or molecular layer deposition. The superlattice 25 includes a plurality of layer groups 45a–45n arranged in stacked relation, as perhaps best understood with specific reference to the schematic cross-sectional view of FIG. 5.

Each group of layers 45a–45n of the superlattice 25 illustratively includes a plurality of stacked base semiconductor monolayers 46 defining a respective base semiconductor portion 46a–46n and an energy band-modifying layer 50 thereon. The energy band-modifying layers 50 are indicated by stippling in FIG. 5 for clarity of illustration.

The energy band-modifying layer 50 illustratively includes one non-semiconductor monolayer constrained within a crystal lattice of adjacent base semiconductor portions. In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a–46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below.

As will be appreciated by those skilled in the art, the source/drain regions 22, 23 and gate 35 of the MOSFET 20 may be considered as regions for causing the transport of charge carriers through the superlattice in a parallel direction relative to the layers of the stacked groups 45a–45n. Other such regions are also contemplated by the present invention.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a–46n may comprise a base semiconductor selected from the group consisting of Group IV semiconductors, Group III-V semiconductors, and Group II-VI semiconductors. Of course, the term Group IV semiconductors also includes Group IV—IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 6, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 5 and 6, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art.

Figure 7:
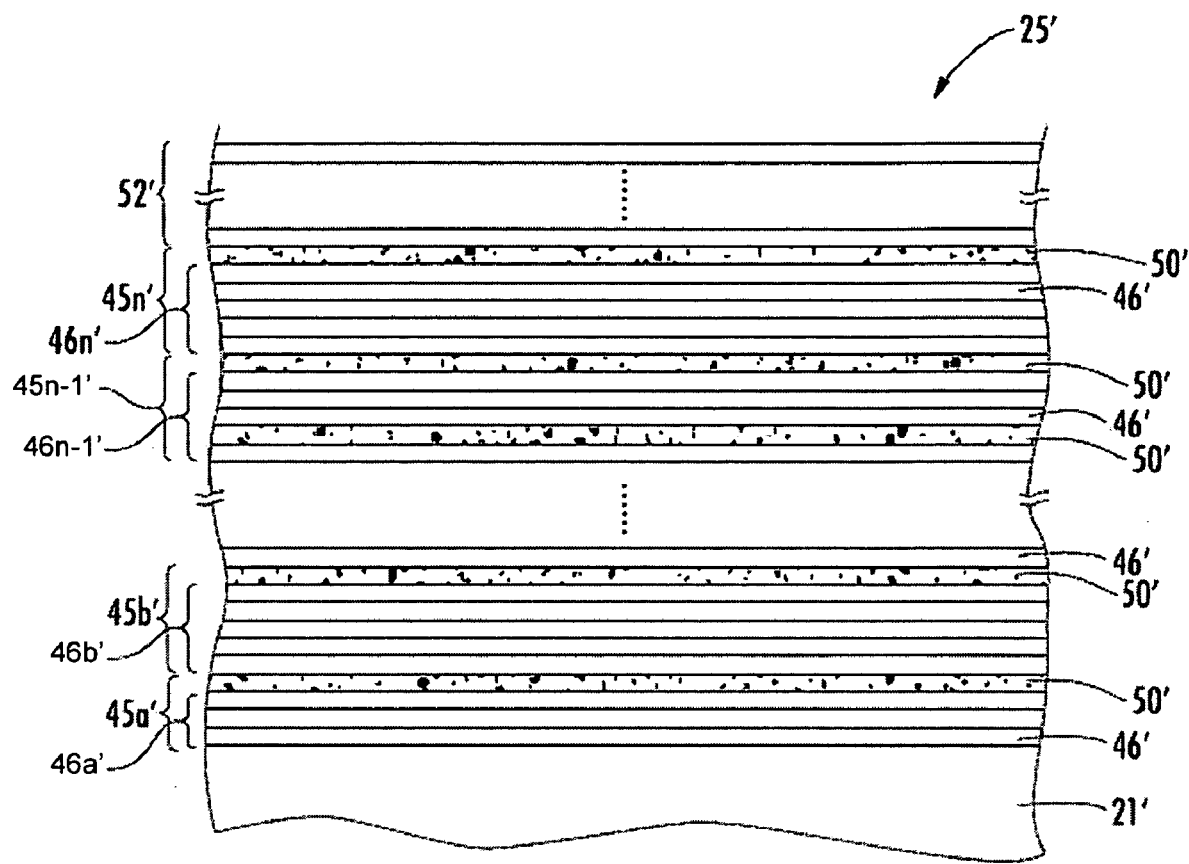
FIG. 7 is a greatly enlarged schematic cross-sectional view of another embodiment of a superlattice that may be used in the device of FIG. 1.

Indeed, referring now additionally to FIG. 7, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 7 not specifically mentioned are similar to those discussed above with reference to FIG. 5 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 8A:
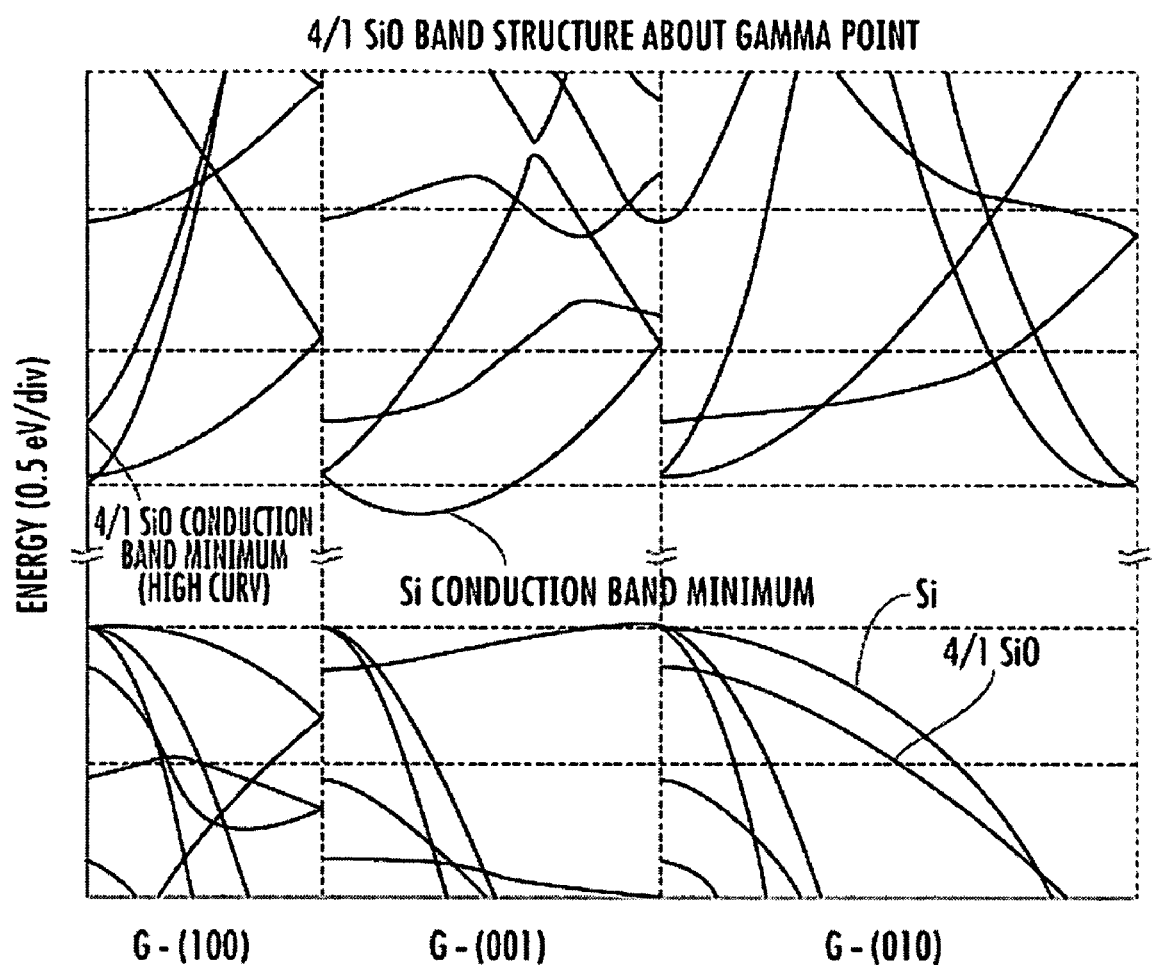
FIG. 8A is a graph of the calculated band structure from the gamma point (G) for both bulk silicon as in the prior art, and for the 4/1 Si/O superlattice as shown in FIGS. 1, 5, and 6.
Figure 8B:
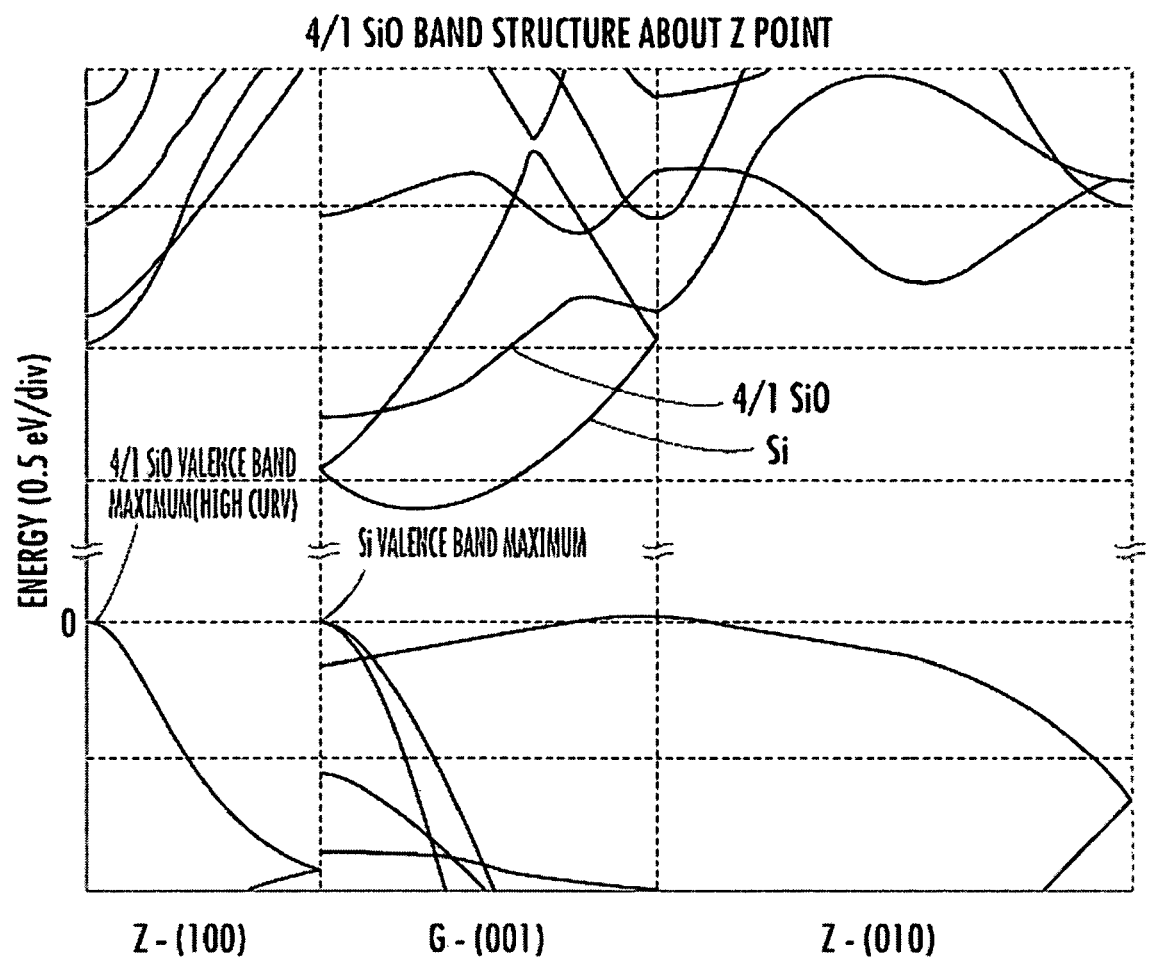
FIG. 8B is a graph of the calculated band structure from the Z point for both bulk silicon as in the prior art, and for the 4/1 Si/O superlattice as shown in FIGS. 1, 5, and 6.
Figure 8C:
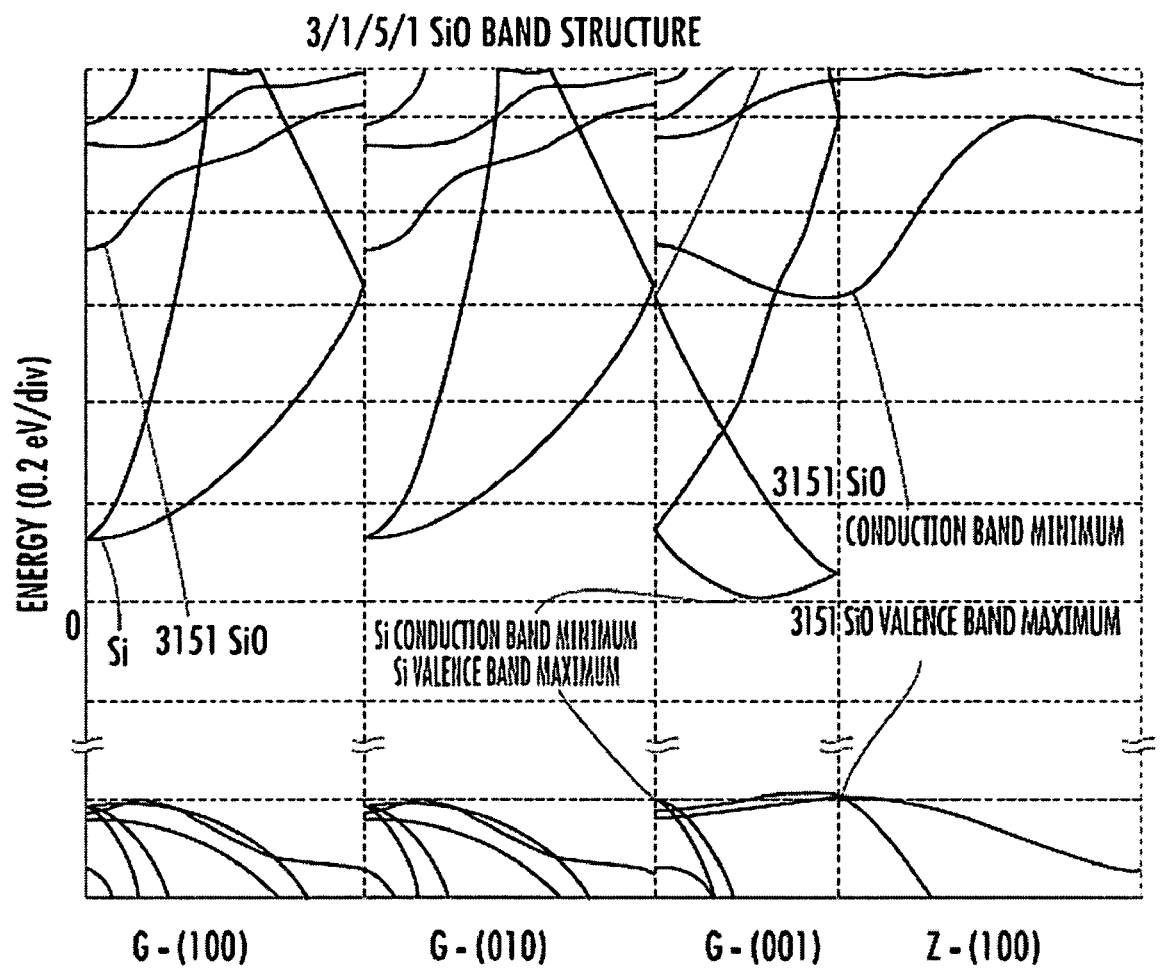
FIG. 8C is a graph of the calculated band structure from both the gamma and Z points for both bulk silicon as in the prior art, and for the 5/1/3/1 Si/O superlattice as shown in FIG. 7.

In FIGS. 8A–8C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 8A shows the calculated band structure from the gamma point (G) for both bulk silicon (represented by continuous lines) and for the 4/1 Si/O superlattice 25 as shown in FIGS. 5–6 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 8B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 8C shows the calculated band structure from both the gamma and Z point for both bulk silicon (continuous lines) and for the 5/1/3/1 Si/O structure of the superlattice 25' of FIG. 7 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

A method aspect of the invention is for making a semiconductor device 20 and may include forming a superlattice 25 comprising a plurality of stacked groups of layers 45. Each group of layers 45 of the superlattice 25 may include a plurality of stacked base silicon monolayers 46 defining a base silicon portion 46a and an energy band-modifying layer 50 thereon. The energy band-modifying layer 50 may include at least one non-semiconductor monolayer constrained within a crystal lattice of adjacent base semiconductor portions 46. The method may further include forming at least one pair of oppositely-doped regions 21, 22 in the superlattice 25 defining at least one semiconductor junction 23.

Another related method aspect of the invention may include forming a semiconductor layer 24" adjacent the superlattice 25" and comprising at least one first region therein including a first conductivity type dopant (N-type in the example illustrated in FIG. 3). At least one second region may be formed in the superlattice including a second conductivity type dopant (P-type in the illustrated example) to define, with the at least one first region, at least one semiconductor junction.

Additional features of the invention may be found in co-pending applications entitled SEMICONDUCTOR DEVICE INCLUDING A SUPERLATTICE WITH REGIONS DEFINING A SEMICONDUCTOR JUNCTION, Ser. No. 11/097,433 METHOD FOR MAKING A SEMICONDUCTOR DEVICE INCLUDING A SUPERLATTICE WITH REGIONS DEFINING A SEMICONDUCTOR JUNCTION, Ser. No. 11/097,612 and SEMICONDUCTOR DEVICE INCLUDING A SUPERLATTICE AND ADJACENT SEMICONDUCTOR LAYER WITH DOPED REGIONS DEFINING A SEMICONDUCTOR JUNCTION, Ser. No. 11/097,588 the entire disclosures of which are hereby incorporated herein by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a superlattice comprising a plurality of stacked groups of layers;
    each group of layers of the superlattice comprising a plurality of stacked base silicon monolayers defining a base silicon portion and an energy band-modifying layer thereon;
    the energy band-modifying layer comprising at least one non-semiconductor monolayer constrained within a crystal lattice of adjacent base silicon portions;
    forming a semiconductor layer adjacent the superlattice and comprising at least one first region therein including a first conductivity type dopant; and
    forming at least one second region in the superlattice including a second conductivity type dopant to define, with the at least one first region, at least one semiconductor junction.

2. The method of claim 1 wherein the at least one first region and the at least one second region are in direct contact with one another.

3. The method of claim 1 wherein the at least one first region and the at least one second region are spaced from one another.

4. The method of claim 1 wherein the at least one first region and the at least one second region are arranged in a vertical direction so that the at least one semiconductor junction extends in a lateral direction.

5. The method of claim 1 wherein the at least one first region and the at least one second region are arranged in a lateral direction so that the at least one semiconductor junction extends in a vertical direction.

6. The method of claim 1 wherein each energy band-modifying layer comprises oxygen.

7. The method of claim 1 wherein each energy band-modifying layer comprises a non-semiconductor selected from the group consisting of oxygen, nitrogen, fluorine, and carbon-oxygen.

8. The method of claim 1 wherein each energy band-modifying layer is a single monolayer thick.

9. The method of claim 1 wherein each base silicon portion is less than eight monolayers thick.

10. The method of claim 1 wherein forming the superlattice further comprises forming a base semiconductor cap layer on an uppermost group of layers.

11. The method of claim 1 wherein all of the base silicon portions are a same number of monolayers thick.

12. The method of claim 1 wherein at least some of the base silicon portions are a different number of monolayers thick.

13. A method for making a semiconductor device comprising:
    forming a superlattice comprising a plurality of stacked groups of layers;
    each group of layers of the superlattice comprising a plurality of stacked base silicon monolayers defining a base silicon portion and an energy band-modifying layer thereon;
    the energy band-modifying layer comprising at least one oxygen monolayer constrained within a crystal lattice of adjacent base silicon portions;
    forming a semiconductor layer adjacent the superlattice and comprising at least one first region therein including a first conductivity type dopant; and
    forming at least one second region in the superlattice including a second conductivity type dopant to define, with the at least one first region, at least one semiconductor junction, the at least one first region and the at least one second region being in direct contact with one another.

14. The method of claim 13 wherein the at least one first region and the at least one second region are arranged in a vertical direction so that the at least one semiconductor junction extends in a lateral direction.

15. The method of claim 13 wherein the at least one first region and the at least one second region are arranged in a lateral direction so that the at least one semiconductor junction extends in a vertical direction.

16. The method of claim 13 wherein each energy band-modifying layer is a single monolayer thick.

17. The method of claim 13 wherein each base silicon portion is less than eight monolayers thick.

18. The method of claim 13 wherein forming the superlattice further comprises forming a base semiconductor cap layer on an uppermost group of layers.

19. The method of claim 13 wherein all of the base silicon portions are a same number of monolayers thick.

20. The method of claim 13 wherein at least some of the base silicon portions are a different number of monolayers thick.

* * * * *

UNITED STATES PATENT AND TRADEMARK OFFICE
CERTIFICATE OF CORRECTION

PATENT NO. : 7,045,377 B2 Page 1 of 1
APPLICATION NO. : 11/096828
DATED : May 16, 2006
INVENTOR(S) : Mears et al.

It is certified that error appears in the above-identified patent and that said Letters Patent is hereby corrected as shown below:

Column 1, Line 49    Delete: "or a binary"
                     Insert: --or binary--

Column 2, Line 66    Delete: "in a silicon"
                     Insert: --in silicon--

Column 2, Line 67    Delete: "electromuminescence"
                     Insert: --electroluminescence--

Column 6, Line 54    Delete: "example"
                     Insert: --example.--

Signed and Sealed this

Seventh Day of November, 2006

JON W. DUDAS
*Director of the United States Patent and Trademark Office*